United States Patent [19]

Matsukawa et al.

[11] Patent Number: 4,620,361
[45] Date of Patent: Nov. 4, 1986

[54] METHOD FOR PRODUCING A SEMICONDUCTOR DEVICE WITH A FLOATING GATE

[75] Inventors: Naohiro Matsukawa, Kamakura; Hiroshi Nozawa, Yokohama; Shigeru Morita, Tokyo, all of Japan

[73] Assignee: Kabushiki Kaisha Toshiba, Japan

[21] Appl. No.: 735,059

[22] Filed: May 17, 1985

[30] Foreign Application Priority Data

May 17, 1984 [JP] Japan .................................. 59-99233

[51] Int. Cl.$^4$ ............................................ H01L 21/76
[52] U.S. Cl. ........................................ 29/571; 427/86; 427/93; 427/94; 430/314; 148/1.5
[58] Field of Search .............. 427/86, 94, 93; 29/571; 430/314; 148/1.5

[56] References Cited

U.S. PATENT DOCUMENTS 4,373,248 2/1983 McElroy .............................. 29/571
4,459,325 7/1984 Nozawa ................................ 427/93

Primary Examiner—John D. Smith
Attorney, Agent, or Firm—Finnegan, Henderson, Farabow, Garrett & Dunner

[57] ABSTRACT

A method for producing a semiconductor device comprises a step of forming a first gate insulation layer on a portion of a single crystal silicon substrate and forming a floating gate of polycrystalline silicon on the first gate insulation layer, a step of forming an oxide layer on the exposed portion of the substrate and on the floating gate, and a step of forming a control gate on the floating gate through the oxide layer. In the formation of the oxide layer, a nitride pattern layer is formed on the floating gate, the entire structure is oxidized by using the nitride pattern layer as a mask, thus forming a protective layer on the exposed portion of the substrate, the nitride pattern layer is removed, and the entire structure is again oxidized, thus forming a second gate insulation layer on the floating gate.

6 Claims, 6 Drawing Figures

METHOD FOR PRODUCING A SEMICONDUCTOR DEVICE WITH A FLOATING GATE

BACKGROUND OF THE INVENTION

This invention relates to a method for producing a semiconductor device with floating gates.

Most non-volatile memories, e.g., EPROMs and EE-PROMs, have floating gate MOS transistors used as memory cells. Bit "1" or "0" is stored in each memory cell in accordance with the electrical charge in the floating gate of the MOS transistor. The floating gate is formed on a channel region of a single crystal semiconductor substrate through a first gate insulation layer. A control gate is formed on the floating gate through a second gate insulation layer. The floating gate is charged or discharged in accordarce with the voltage applied on the control gate. For example, when the control gate and drain of the floating gate MOS transistor respectively receive voltages of 20 V and 5 V in the programming mode of the EPROM, hot electrons move from the channel region into the floating gate through the first gate insulation layer. As a result, the floating gate is charged. The electrical charge within the floating gate is preserved since the gate is electrically insulated from the outside by the first and second insulation layers. The floating gate is usually made of polycrystalline silicon.

In the non-volatile memory of this type, the surface region of the substrate is divided by a field insulation layer into a plurality of element areas. The known method of producing this memory will now be explained.

First, a field insulation layer is formed on a semiconductor substrate, thus dividing the surface region of the substrate into element areas. The substrate is subjected to a first oxidation process, forming an oxide layer on the field insulation layer and on the element areas. Then, a first polycrystalline silicon layer is formed on the oxide layer by chemical vapor deposition (CVD). A photoresist pattern is formed on the silicon layer. By using this pattern as a mask, the silicon layer and oxide layer are patterned. More specifically, that portion of the silicon layer which is not covered by the mask is removed from the oxide layer, and the remaining portion is left and used as a floating gate. That portion of the oxide layer which is located directly below the floating gate is left and used as a first gate insulation layer, and the remaining portion is removed from the element area. Thereafter, the entire structure is subjected to the second oxidation, thereby forming an oxide layer on the exposed element area and the floating gate. (Any portion of this oxide layer that covers an element area is to protect the elements which will be formed. Any portion of the oxide layer that covers a floating gate is used as the second gate insulation layer.) Then, a second polycrystalline silicon layer is formed on the oxide layer by vapor-deposition. This second polycrystalline silicon layer is patterned, whereby some portions are removed. The portion left on the oxide layer is used as control gate and connecting line. The control gate is located above the floating gate.

In the method described above, the layer for protecting elements is formed during the second oxidation, together with the second gate insulation layer. Its thickness cannot be controlled independently of that of the second gate insulation layer. Since single crystal silicon is harder to oxidize than polycrystalline silicon, the second gate insulation layer cannot be thinner than the protecting layer.

The protective layer must be thick enough to electrically insulate the semiconductor substrate from the first and second polycrystalline silicon layers. On the other hand, the second gate insulation layer must be thin enough to reduce the energy (i.e. voltage X time) needed for charging and discharging the floating gates. In view of this, the above method, wherein the thicknesses of the protective layer and second gate insulation layer cannot be controlled independently, is disadvantageous.

SUMMARY OF THE INVENTION

The object of the present invention is to provide a method for producing a semiconductor device with a floating gate of polycrystalline silicon on a semiconductor substrate of single crystal silicon wherein the semiconductor substrate is fully insulated from gate electrodes and connecting lines, the floating gate can be charged or discharged under the control of a relatively low voltage.

According to the invention, there is provided a method for producing a semiconductor device, which comprises a first step of forming a semiconductor structure including a first gate insulation layer on a single crystal semiconductor substrate, a polycrystalline floating gate on the first gate insulation layer, and a nitride pattern layer on the floating gate; a second step of oxidizing the substrate by using the nitride pattern layer as a mask, thereby forming a first oxide layer on the exposed portion of the substrate; a third step of removing the nitride pattern layer; a fourth step of oxidizing the semiconductor structure obtained in the third step, thereby forming a second oxide layer covering the floating gate, the second oxide layer being used as a second gate insulation layer; and a fifth step of forming a control gate on the second oxide layer.

DETAILED DESCRIPTION OF THE PREFERRED EMBODIMENT

Figure 1:
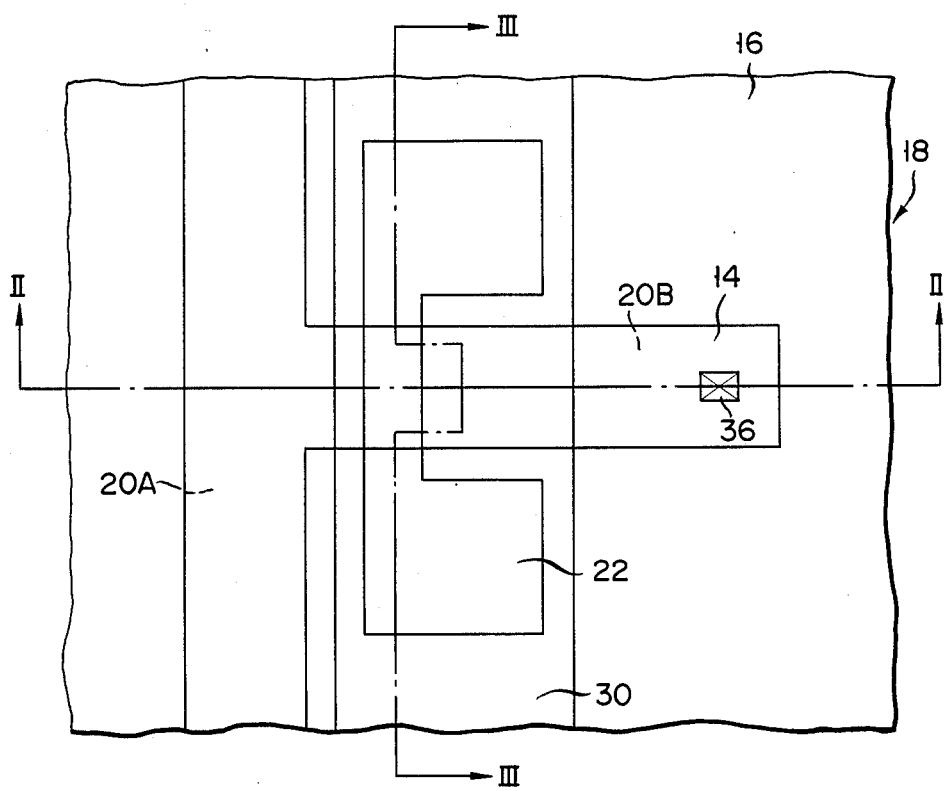
FIG. 1 is a plan view of a memory cell of an EPROM produced by the method of this invention.
Figure 2:
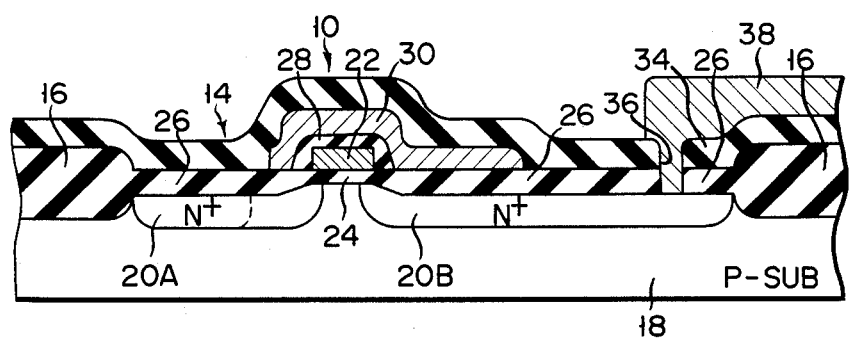
FIG. 2 is a cross-sectional view of the memory cell, taken along line II—II in FIG. 1.

One embodiment of this invention will be described with reference to FIGS. 1-2 and FIGS. 3A–3D. FIG. 1 is a plan view of one of the memory cells of an EPROM made by the method of this invention. FIG. 2 is a cross-sectional view of the memory cell, taken along line II—II in FIG. 1. As shown in FIGS. 1 and 2, the memory cell comprises a floating gate MOS transistor 10 formed in an element area 14. Element area 14 is surrounded by a field insulation layer 16 formed on the surface of a P-type single crystal silicon substrate 18. Transistor 10 is provided to store a one-bit data. $N^+$-type regions 20A and 20B are formed in element area 14. Regions 20A and 20B are the source and drain of floating gate MOS transistor 10. A floating gate 22 made of polycrystalline silicon is formed on a first gate insulation layer 24 which in turn is formed on the channel region located between N+-type regions 20A and 20B. A protective layer 26 is formed on element area 14, and a second gate insulation layer 28 is formed on floating gate 22. A control gate 30 of transistor 10 is formed on protective layer 26 and second gate insulation layer 28 and positioned above floating gate 22. A drain electrode 34 extends through a contact hole 36 cut in layer 26 and contacts N+-type region 20B.

Figure 3A:
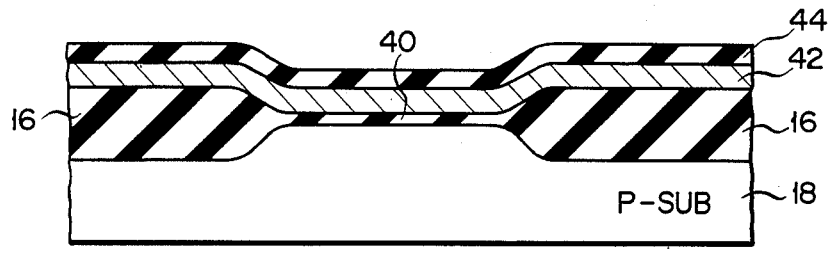
FIGS. 3A–3D are cross-sectional views taken along line III—III in FIG. 1, illustrating how the EPROM of FIG. 1 is manufactured.

It will now be explained how the EPROM is made, with reference to FIGS. 3A-3D. First, as shown in FIG. 3A, field insulation layer 16 is formed on the surface of substrate 18 by the LOCOS method. Oxide layer 40 is formed on element area 14 by thermal oxidizing. A polycrystalline silicon layer 42 is formed on oxide layer 40 and field insulation layer 16. Further, a silicon nitride layer 44 is deposited on layer 42. A photoresist layer (not shown) is formed on silicon nitride layer 44.

Figure 3B:
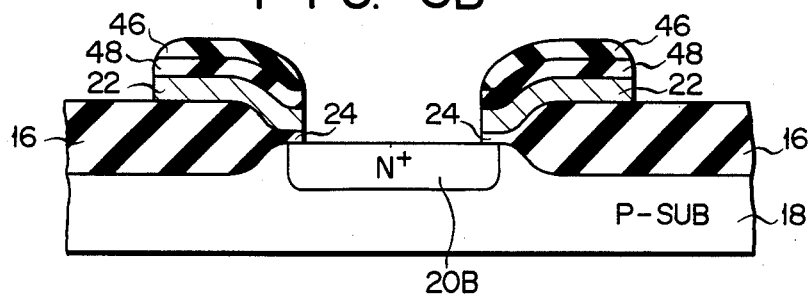

As shown in FIG. 3B, the photoresist layer is selectively photoetched, providing a pattern 46. Oxide layer 40, polycrystalline silicon layer 42 and silicon nitride layer 44 are selectively etched by using pattern 46 as a mask, thereby forming first gate insulation layer 24, floating gate 22 and silicon nitride pattern 48. By this selective etching, a part of element area 14 is exposed. Thereafter, N+-type regions 20A and 20B are formed in the element area, wherein pattern 46 is used as a mask.

Figure 3C:
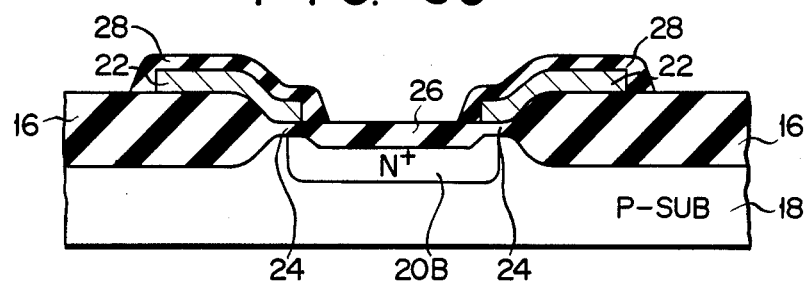
Figure 3D:
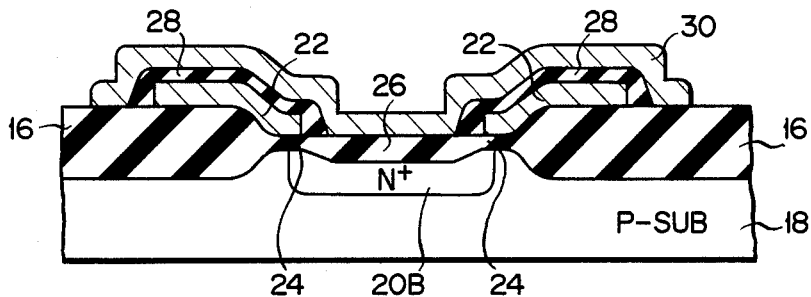

Pattern 46 is removed as shown in FIG. 3C. Semiconductor structure is thermally oxidized, thus forming protective layer 26 on the exposed portion of element area 14 and the side portion of floating gate 22. Pattern 48 is removed from polycrystalline silicon layer 22. Layer 22 is thermally oxidized, forming second gate insulation layer 28 as shown in FIG. 3C. Then, a polycrystalline silicon layer (not shown) is deposited on field insulation layer 16, second insulation layer 28 and protective layer 26. This polycrystalline silicon layer is selectively etched, forming a pattern. This pattern is used, forming control gate 30 (FIG. 3D). Finally, oxide layer 34 is formed on the entire surface of the semiconductor structure as shown in FIG. 2. Oxide layer 34 is cut to form a contact hole 36 above N+-type region 20B. A connecting layer 38 of aluminum is formed on oxide layer 34 and connected to N+-type region 20B via contact hole 36.

In the method, protective layer 26, which covers the exposed part of substrate 18, is formed by oxidizing substrate 18 and using pattern 48 as a mask after resist pattern 46 (FIG. 3B) has been removed. On the other hand, second gate insulation layer 28 is formed by oxidizing floating gate 22 after nitride layer 48 (FIG. 3B) has been removed. Since layers 26 and 28 are formed in different steps, they can have different thicknesses. For example, when an insulated gate MOS transistor is additionally provided in the element area 14, layer 26 insulates the control gate of this transistor. Then, layer 26 is thick enough to give this transistor a sufficiently high breakdown voltage, and layer 28 is made thinner than layer 26. Hence, floating gate MOS transistor 10 can be charged or discharged very quickly; the EPROM can be programmed or erased in a short time. The voltage to be applied to control gate 30 to program or erase the memory can therefore be lowered.

In the above embodiment, nitride pattern 48 is directly formed on floating gate 22. Instead, an oxide layer may be formed between floating gate 22 and nitride pattern 48. In the step of removing nitride pattern 48, the etching process can be reliably stopped before floating gate 22 is etched. This oxide layer may be used as second gate insulation layer 28. The oxide layer may be also rejected before forming layer 28. Moreover, a thermal process may be applied to the oxide layer and floating gate to form second gate insulation layer 28.

With the method of this invention it is possible to form an insulation layer of any desired thickness on the single crystal substrate and the polycrystalline floating gate. Hence, in the semiconductor device made by this method, the substrate can be sufficiently insulated from control gate and connecting lines and the floating gate can be charged or discharged under the control of a relatively low voltage.

What is claimed is:

1. A method for producing a floating gate type MOS transistor, which comprises:
    a first step of forming a semiconductor structure covering a part of an element area of a semiconductor substrate, said structure including a first gate insulation layer on said element area, a floating gate on said first gate insulation layer, and a nitride pattern layer on said floating gate;
    a second step of forming source and drain regions in said element area;
    a third step of forming a protective layer covering the exposed portion of said element area by oxidizing the substrate using the nitride pattern as a mask;
    a fourth step of removing said nitride pattern layer from the floating gate after the third step;
    a fifth step of forming a second gate insulation layer on the floating gate; and
    a sixth step of forming a control gate on said second gate insulation layer.

2. A method according to claim 1, further comprising a seventh step of forming a field insulation layer on said substrate to define said element area.

3. A method according to claim 1, wherein said first step includes a first substep of forming an oxide layer on the entire surface of said element area and field insulation layer, a second substep of forming a conductive layer on the entire surface of said oxide layer, a third substep of forming a nitride pattern layer on the entire surface of said conductive layer, a fourth substep of forming a resist pattern on said nitride pattern layer, and a fifth substep of etching said nitride pattern layer, the conductive layer and the oxide layer using the resist pattern as a mask, the masked portions being left as said first insulation layer, floating gate, nitride pattern.

4. A method according to claim 3, wherein said substrate is made of single crystal silicon, and said floating gate is made of polycrystalline silicon.

5. A method according to claim 4, wherein said second gate insulation layer is formed with a first thickness, and said protection layer is formed with a second thickness larger than said first thickness.

6. A method acording to claim 1, wherein said fifth step includes a sixth substep of oxidizing said floating gate to form said second gate insulation layer.

* * * * *